(12) United States Patent
Akahori et al.

(10) Patent No.: US 8,133,782 B2
(45) Date of Patent: Mar. 13, 2012

(54) NONVOLATILE SEMICONDUCTOR MEMORY DEVICE AND MANUFACTURING METHOD THEREOF

(75) Inventors: Hiroshi Akahori, Yokohama (JP); Wakako Takeuchi, Yokohama (JP); Atsuhiro Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/028,730

(22) Filed: Feb. 16, 2011

(65) Prior Publication Data

US 2011/0136330 A1 Jun. 9, 2011

Related U.S. Application Data

(62) Division of application No. 11/798,888, filed on May 17, 2007, now Pat. No. 7,906,804.

(30) Foreign Application Priority Data

Jul. 19, 2006 (JP) .................................. 2006-197258

(51) Int. Cl.
*H01L 21/8247* (2006.01)
(52) U.S. Cl. ................. 438/257; 257/E21.422; 438/260
(58) Field of Classification Search .......... 438/257–267; 257/314–323, E21.422, E27.103, E21.179
See application file for complete search history.

(56) References Cited

U.S. PATENT DOCUMENTS

| 5,067,109 | A | * | 11/1991 | Kim et al. ................. 365/189.05 |
| 5,599,727 | A | * | 2/1997 | Hakozaki et al. ............. 438/261 |
| 6,768,161 | B2 | | 7/2004 | Kinoshita |
| 7,227,219 | B2 | | 6/2007 | Mikolajick |
| 2005/0029576 | A1 | * | 2/2005 | Matsuno et al. ............... 257/314 |
| 2005/0029578 | A1 | | 2/2005 | Nishizaka |
| 2005/0212036 | A1 | * | 9/2005 | Tanaka et al. .................. 257/316 |
| 2005/0282338 | A1 | * | 12/2005 | Yoo et al. ........................ 438/257 |
| 2006/0051921 | A1 | | 3/2006 | Youn et al. |
| 2006/0240619 | A1 | * | 10/2006 | Ozawa et al. .................. 438/257 |

FOREIGN PATENT DOCUMENTS

| JP | 1-226158 | 9/1989 |
| JP | 3-132078 | 6/1991 |
| JP | 11-154711 | 6/1999 |

(Continued)

OTHER PUBLICATIONS

Notification of Reasons for Rejection issued by the Japanese Patent Office on May 10, 2011, for Japanese Patent Application No. 2007-155676 and English-language translation thereof.

*Primary Examiner* — Matthew W Such
*Assistant Examiner* — Ali Naraghi
(74) *Attorney, Agent, or Firm* — Finnegan, Henderson, Farabow, Garrett & Dunner, L.L.P.

(57) ABSTRACT

A memory device includes a semiconductor substrate, memory elements formed above the substrate in rows and columns, bit lines and word lines selectively connected with the memory elements in the respective columns and rows, each memory element including, a first gate insulator formed above the substrate, a charge accumulation layer formed on the first gate insulator, a second gate insulator formed on the charge accumulation layer, and a control electrode formed on the second gate insulator, wherein a ratio r/d is not smaller than 0.5, where r: a radius of curvature of an upper corner portion or surface roughness of the charge accumulation layer and d: an equivalent oxide thickness of the second gate insulator in a cross section along a direction vertical to the bit lines.

5 Claims, 15 Drawing Sheets

FOREIGN PATENT DOCUMENTS

| | | |
|---|---|---|
| JP | 2000-200841 | 7/2000 |
| JP | 2003-31705 | 1/2003 |
| JP | 3484023 | 10/2003 |
| JP | 2005-109034 | 4/2005 |
| JP | 2005-167132 | 6/2005 |
| WO | WO 2005-074036 A1 | 11/2005 |

* cited by examiner

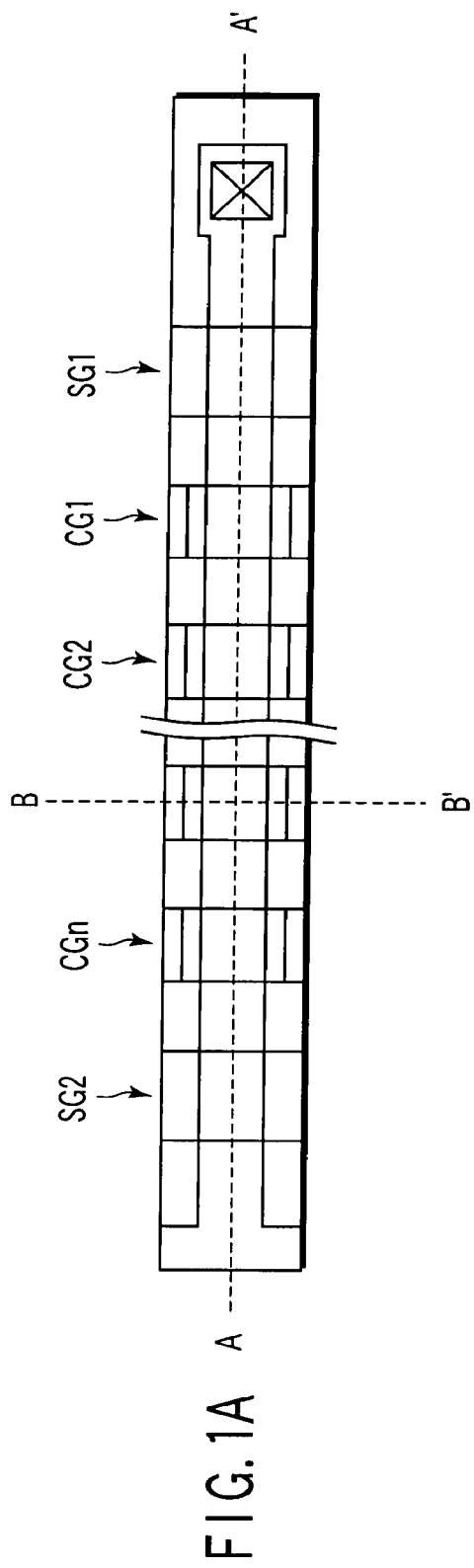
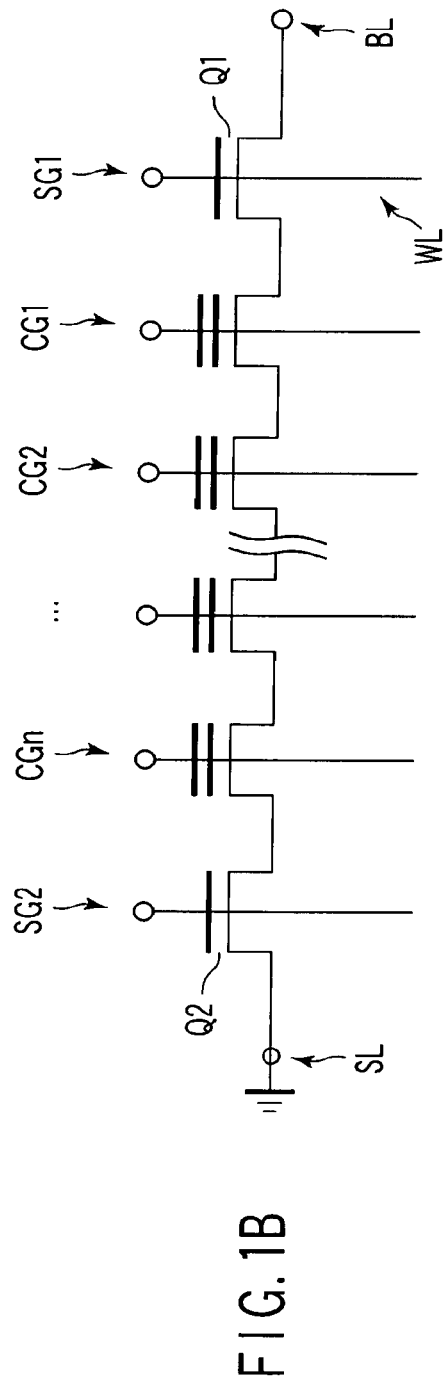
FIG. 1A
FIG. 1B

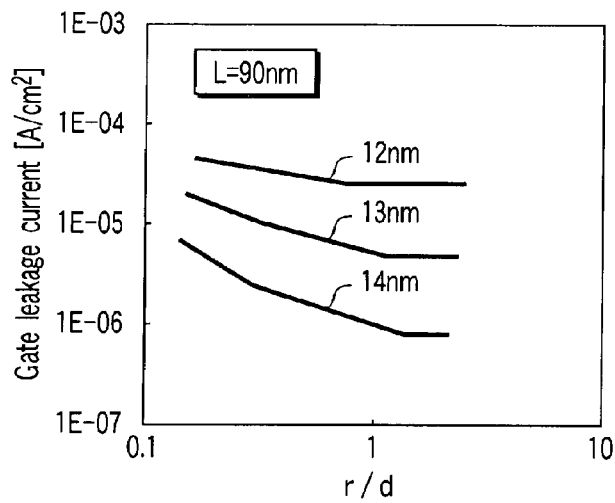
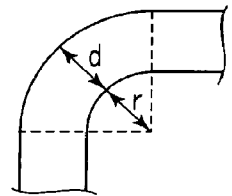
FIG. 20B
FIG. 20A
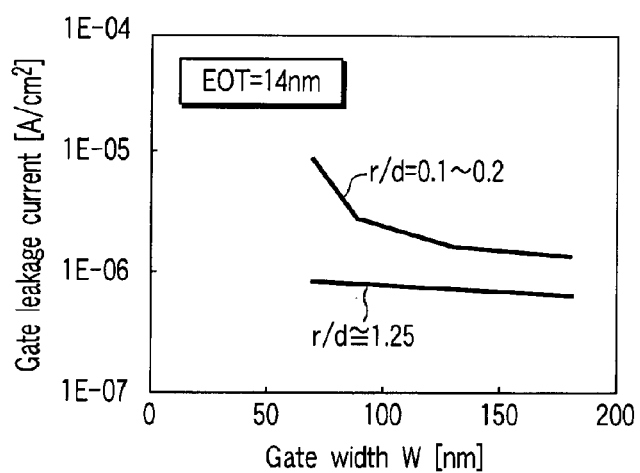
FIG. 21

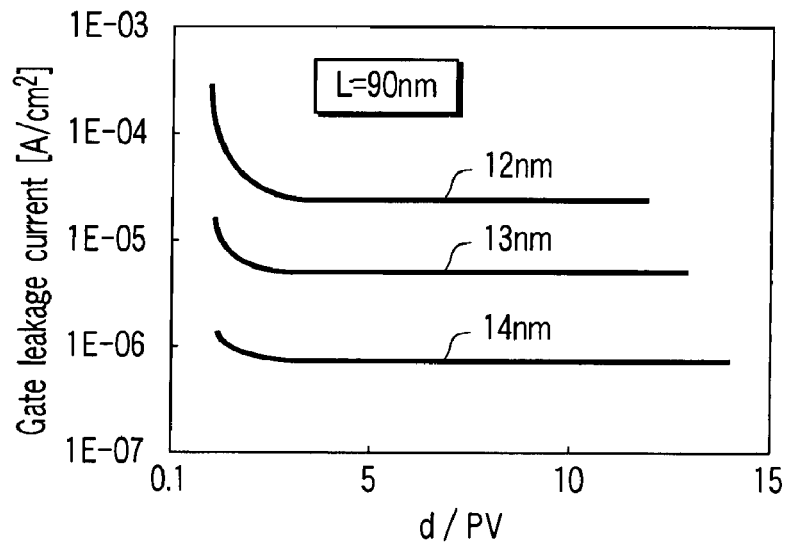
F I G. 23
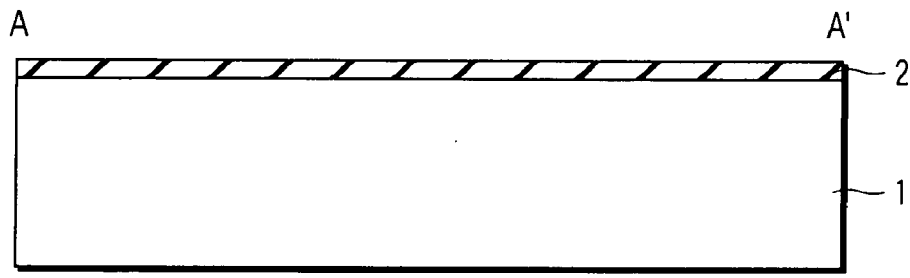
F I G. 24
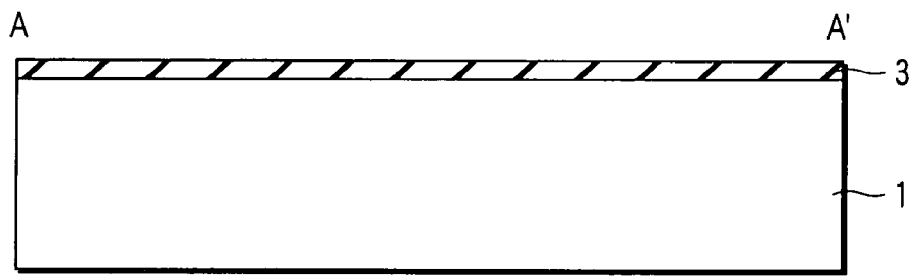
F I G. 25

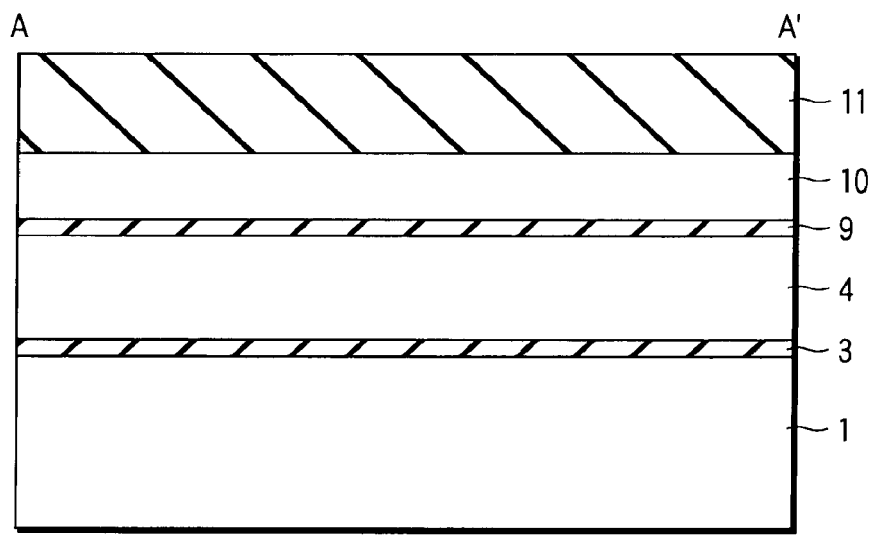
F I G. 26
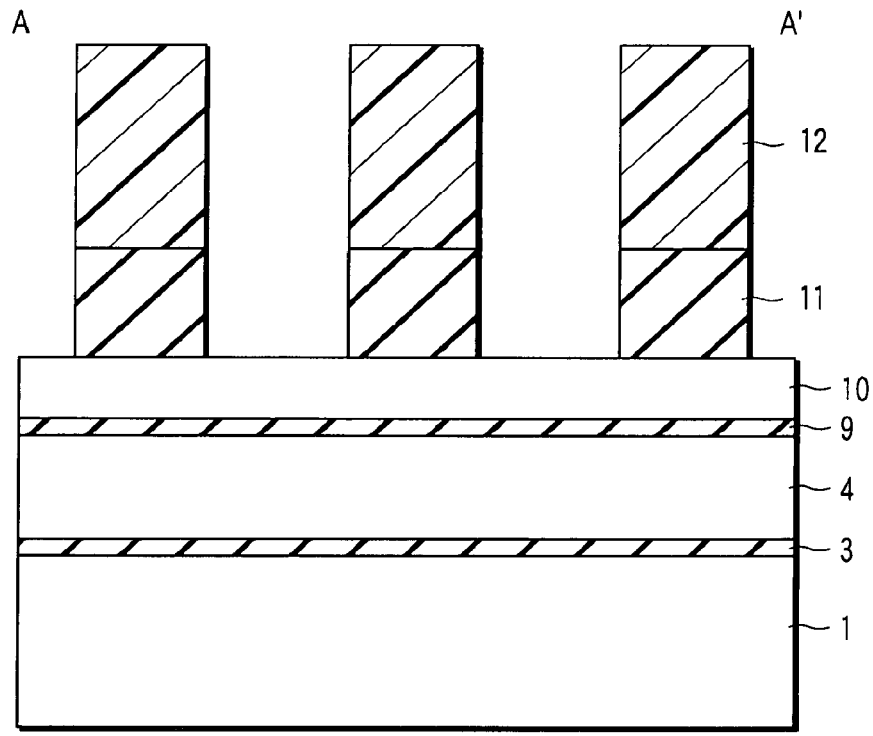
F I G. 27

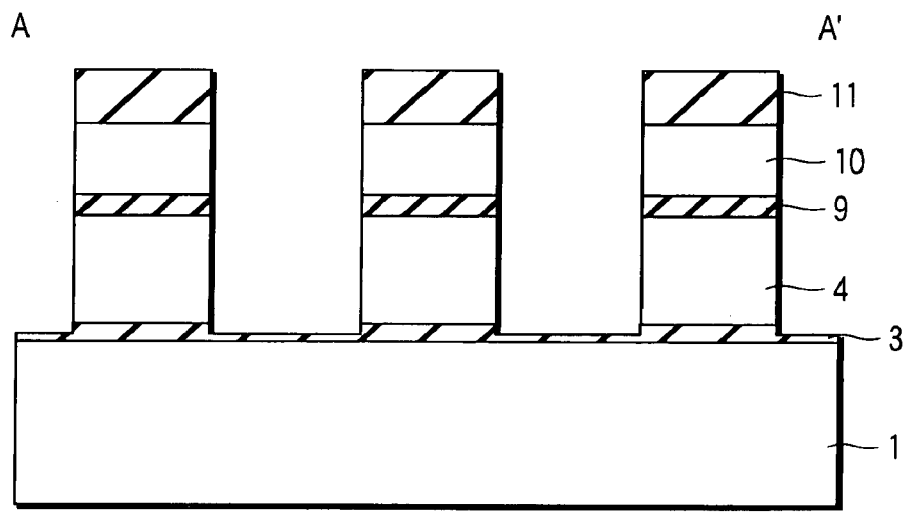
F I G. 28
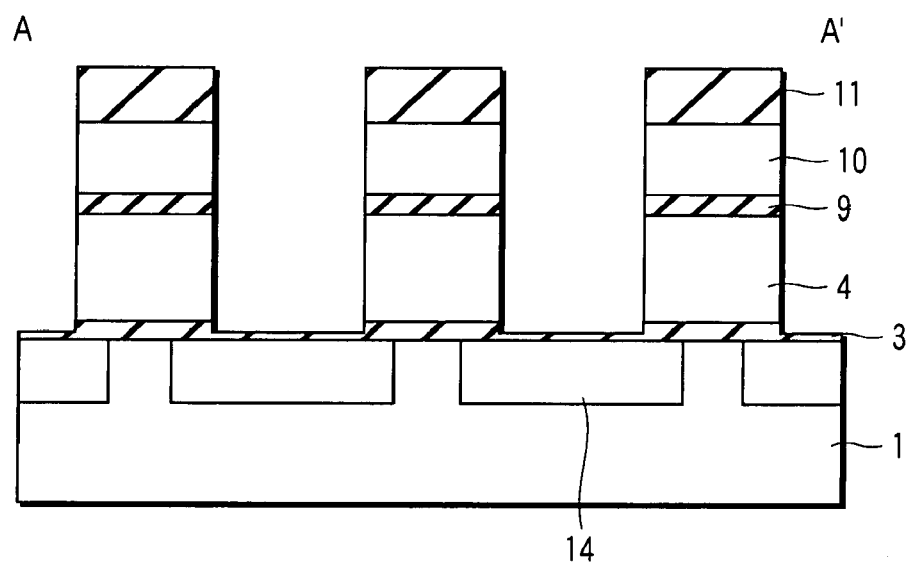
F I G. 29

NONVOLATILE SEMICONDUCTOR MEMORY DEVICE AND MANUFACTURING METHOD THEREOF

CROSS-REFERENCE TO RELATED APPLICATIONS

This application is a divisional application of application Ser. No. 11/798,888, filed May 17, 2007 now U.S. Pat. No. 7,906,804, which claims priority from prior Japanese Patent Application No. 2006-197258, filed Jul. 19, 2006, the entire contents of both of which are incorporated herein by reference.

BACKGROUND OF THE INVENTION

1. Field of the Invention

The present invention relates to a nonvolatile semiconductor memory device in which data is electrically written/erased, and more particularly to a nonvolatile semiconductor memory device having a stacked gate structure, and the manufacturing method thereof.

2. Description of the Related Art

Generally, in a manufacturing process of an MOS type semiconductor device, polysilicon as an electrode material is exposed on a sidewall portion of a gate electrode immediately after forming the gate electrode with use of etching, and an edge of the gate oxide film is damaged by the etching. Therefore, recovery due to post oxidation from the damage and the gate electrode encapsulation with an insulating film are required. In case of a nonvolatile memory having a stacked gate structure in particular, since electric charges are held in a floating gate, a film quality of a gate oxide film in the vicinity of a corner portion of the floating gate greatly affects characteristics of a device. Accordingly, many proposals have been made in relation to an improvement in a gate corner portion.

For example, in Jpn. Pat. Appln. KOKAI No. 1999-154711, after an SiON film is selectively formed on the sidewall of the floating gate and the top and sidewall of the control gate, annealing in an oxidation atmosphere is performed as the post oxidation. This process promotes the growth of an oxidation film at an edge portion of the tunneling oxide film or the inter-poly dielectric. In this way, formation of the SiON film on the sidewall of the floating gate prevents the oxidation of that portion, and at the same time the corners of the floating gate edge are rounded.

On the other hand, Jpn. Pat. Appln. KOKAI No. 2003-31705 discloses a semiconductor device in which an ONO film (composite film composed of a silicon oxide film/a silicon nitride film/a silicon oxide film) is used as an inter-electrode dielectric of a stacked gate and a gate sidewall insulating film is also provided. The gate sidewall insulating film is formed with use of radical oxidation, and the corners of the floating gate and control gate contacting the ONO film are rounded, thereby relaxing the electric field concentration at the gate edges. Further, a preferable relation between the inter-poly dielectric and the radius of curvature of the gate corners is proposed.

Further, in a floating gate type nonvolatile memory having a tunneling insulating film and an inter-electrode insulating film, in order to suppress leakage current flowing through the inter-electrode insulating film, a film thickness of this insulating film is usually increased to reduce an electric field applied thereto. Since a capacitance of the inter-electrode insulating film is lowered with an increase in the film thickness, a surface area of a floating gate electrode must be increased. Usually, a surface of the floating gate electrode on which the inter-electrode insulating film is formed is not formed into a simple planar shape but three-dimensionally protruded to increase a capacitor area, thus increasing the capacitance. Here, as a problem in three-dimensional formation, several convex portions are necessarily formed in the three-dimensional capacitor in some cases. When a voltage is applied to a control gate electrode, an electric field is concentrated on such a convex portion, and hence this portion serves as a main path of leakage current. Furthermore, since a current is concentrated, deterioration in dielectric breakdown strength locally occurs, which induces degradation in electrical reliability.

Moreover, although polysilicon is usually used for a floating gate electrode, there is surface roughness because of existence of a grain boundary, and hence uniform surface morphology cannot be obtained. An increase in leakage current due to concentration of an electric field can be observed at a part having such roughness, resulting in deterioration in electrical reliability. How such roughness in a three-dimensional capacitor is controlled to suppress leakage current is very important.

Meanwhile, in a prior art known in the patent reference mentioned above and the like, since a bird's beak type oxidized region is formed at an end portion of an inter-electrode insulating film of a stacked gate, there is a problem of a reduction in the capacitance of the inter-electrode insulating film and a reduction in a coupling ratio between stacked gates. Additionally, control over roughness in a surface of the three-dimensional capacitor of a stacked gate (control over roughness in an upper surface of a floating gate in particular) and suppression of leakage current through the inter-electrode insulating film are serious problems.

Therefore, there has been demanded realization of a nonvolatile semiconductor memory device in which leakage current is suppressed through an inter-electrode insulating film to improve electrical reliability and the manufacturing method thereof.

BRIEF SUMMARY OF THE INVENTION

According to a first aspect of the invention, there is provided a non-volatile semiconductor memory device, which includes:

a semiconductor substrate;

a plurality of memory elements formed above the semiconductor substrate in rows and columns;

a plurality of bit lines selectively connected with the plurality of memory elements in the respective columns; and a plurality of word lines connected with the plurality of memory elements in the respective rows, each of the plurality of memory elements comprising:

a first gate insulating film formed above the semiconductor substrate;

a charge accumulation layer formed on the first gate insulating film;

a second gate insulating film formed on the charge accumulation layer; and a control electrode formed on the second gate insulating film, wherein a ratio r/d is not smaller than 0.5, in which r is a radius of curvature of an upper corner portion or surface roughness of the charge accumulation layer and d is an equivalent oxide thickness of the second gate insulating film in a cross section along a direction vertical to the bit lines.

According to a second aspect of the invention, there is provided a manufacturing method a non-volatile semiconductor memory device, which includes:

forming a first gate insulating film above a semiconductor substrate;

sequentially forming a charge accumulation layer and a mask layer on the first gate insulating film;

processing the mask layer into a predetermined pattern;

etching the charge accumulation layer, the first gate insulating film and an upper part of the semiconductor substrate to form a plurality of gate structures with the processed mask layer being used as a mask;

filling a buried insulating film between the plurality of gate structures;

flattening the buried insulating film, followed by setting an upper surface of the buried insulating film to be lower than an upper surface of the charge accumulation layer, and rounding an upper corner of the charge accumulation layer;

depositing a second gate insulating film on an entire surface after rounding the upper corner of the charge accumulation layer;

forming a control gate layer on the second gate insulating film;

patterning the control gate layer to form a plurality of control gates; and etching a stacked film composed of the second insulating film, the charge accumulation layer and the first insulating film to form a plurality of stacked gate structures with the plurality of control gates being used as a mask.

BRIEF DESCRIPTION OF THE SEVERAL VIEWS OF THE DRAWING

FIG. 1A is a plan view showing a cell array structure of an NAND type flash memory;

FIG. 1B is an equivalent circuit diagram of FIG. 1A;

FIG. 17A shows characteristics of a device depicted in FIGS. 17B and 17C;

FIG. 20A is a characteristic view showing a relationship between a ratio of an equivalent silicon oxide thickness d of an inter-electrode insulating film and a radius r of curvature and leakage current density;

FIG. 20B is a schematic view showing definitions of the radius r of curvature of a corner portion and a film thickness d of the insulating film in FIG. 20A;

FIG. 21 is a characteristic view showing a relationship between a gate width and leakage current density;

FIG. 23 is a characteristic view showing a relationship between a ratio of the film thickness d of the inter-electrode insulating film and roughness PV of a floating gate surface and leakage current density; and FIGS. 24 to 29 are cross-sectional views illustrating a manufacturing process of a nonvolatile memory according to a third embodiment step by step and correspond to cross-sectional views taken along the line A-A' in FIG. 1.

DETAILED DESCRIPTION OF THE INVENTION

Figure 2:
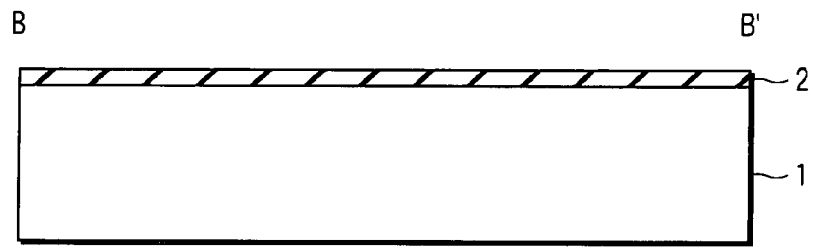
FIGS. 2 to 11 are cross-sectional views illustrating a manufacturing method of a semiconductor device according to a first embodiment of the present invention and also are cross-sectional views taken along a line B-B' in FIG. 1.

Prior to an explanation of embodiments according to the present invention, a structure of an NAND type flash memory as an example of a semiconductor nonvolatile memory device and a problem in characteristics therefore will be briefly described. As shown in FIGS. 1A and 1B, in a cell array of the NAND type flash memory, a plurality of cell transistors CG1 to CGn consisting of n-channel MOSFETs each having a floating gate and a control gate are connected in series, a drain on one end side is connected with a bit line BLi (i=1, 2 . . . ) through a selection NMOS transistor Q1, while a source on the other end side is connected with a source line SL through a selection NMOS transistor Q2.

The respective transistors are formed on the same well (a substrate), control electrodes of the cell transistors CG1 to CGn are connected with word lines WL1 to WLn continuously arranged in a row direction, a control electrode of the selection transistor Q1 is connected with a selection line SG1, and a control electrode of the selection transistor Q2 is connected with a selection line SG2. Further, one end of each word line has a connection pad connected to a peripheral circuit through a metal wiring line and is formed on an isolation film.

The point of this device exists in that a threshold voltage of a cell transistor is adjusted by injecting electrons into the floating gate. Maintaining the electrons injected into the floating gate makes the operation of the nonvolatile memory device steady. Incidentally, the present cell configuration includes a floating gate of a three dimensional cubic structure. In order to suppress leakage current flowing through the inter-electrode dielectric, such measures are commonly taken that a thickness of the inter-electrode dielectric is increased and the electric field applied thereto is reduced. In accordance with the film thickness increase, capacitance between the stacked gates is lowered. Therefore, it is needed to increase the surface area of the floating gate. In general, a surface of the floating gate, on which the inter-electrode dielectric is formed, is shaped to be three-dimensionally protruded, thereby increasing the capacitance area and the capacitance itself, as a result. Here, a problem is accompanied with the three-dimensional capacitor that plural protrusions are inevitably formed on the capacitor. Application of a voltage to the control gate concentrates an electric field to the protrusions, thereby making a main path of leakage current. In addition, the current concentration produces degradation of dielectric breakdown strength and induces degradation of electrical reliability of the device.

Embodiments according to the present invention coping with the above-mentioned problem will now be described hereinafter with reference to the accompanying drawings.

First Embodiment

A manufacturing process of an NAND cell type flash memory according to a first embodiment will now be described based on cross-sectional views taken along a line A-A' and a line B-B' in FIG. 1. It is to be noted that FIGS. 2 to 11 are cross-sectional views taken along the line B-B' (which will be referred to as B-B' cross-sectional views hereinafter).

Figure 3:
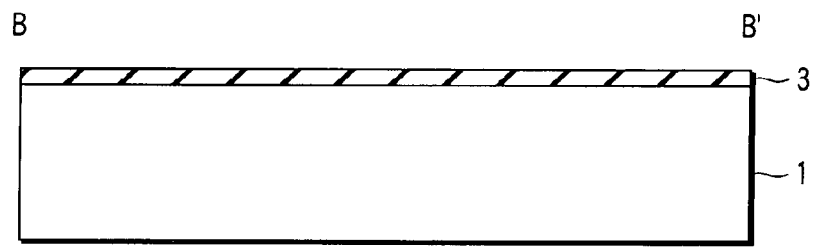
Figure 4:
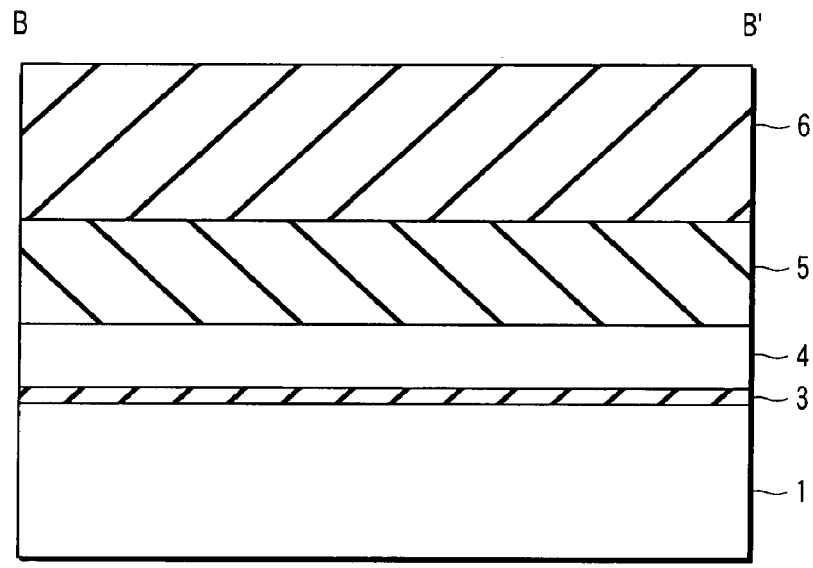

First, as shown in FIG. 2, a thermal oxidation method is used to form a silicon oxide film 2 on a silicon substrate 1. This silicon oxide film 2 is nitrided by using an $NH_3$ gas to obtain a silicon oxynitride film 3 (FIG. 3). This silicon oxynitride film 3 functions as a first gate insulating film and is generally referred to as a tunneling oxide film. Moreover, a polysilicon film 4, a silicon nitride film (first sacrificial insulating film) 5 and a silicon oxide film (second sacrificial insulating film) 6 are deposited on the silicon oxynitride film 3 by using a chemical vapor deposition (CVD) method (FIG. 4). In general, this polysilicon film 4 functions as a charge accumulation layer and is called a floating gate.

Figure 5:
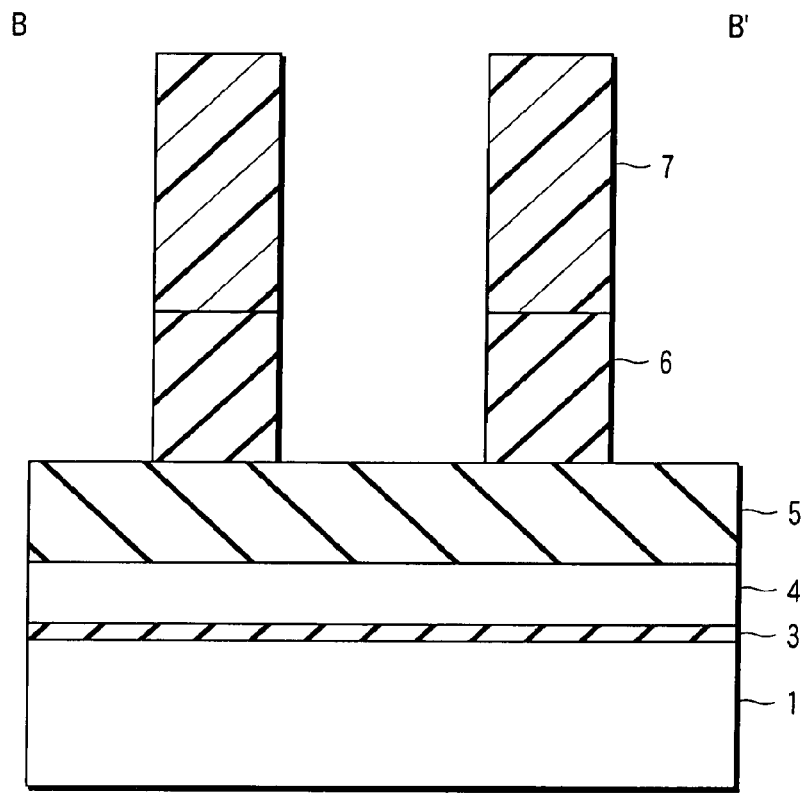
Figure 6:
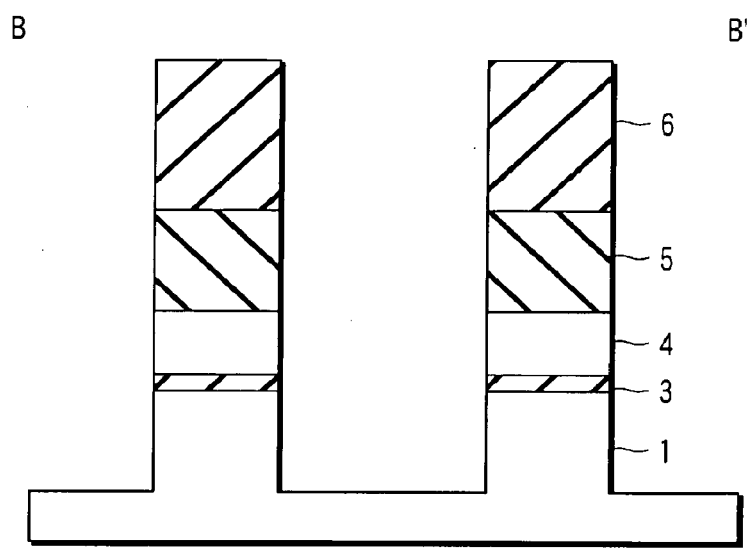

Subsequently, a photoresist 7 is applied, and then the silicon oxide film 6 is patterned by a lithography method (FIG. 5). The photoresist 7 is removed, and then the silicon nitride film 5, polysilicon film 4, silicon oxynitride film 3 and silicon substrate 1 are etched using the silicon oxide film 6 as a mask (FIG. 6).

Figure 7:
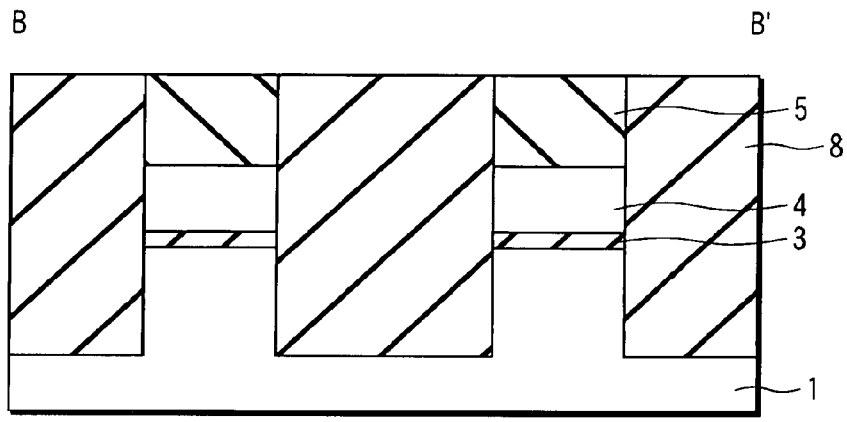
Figure 8:
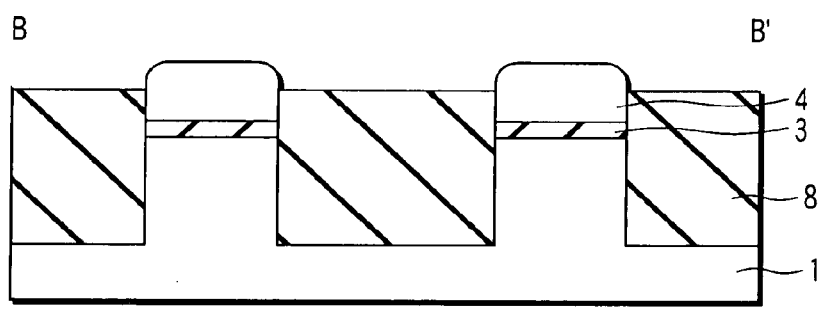
Figure 9:
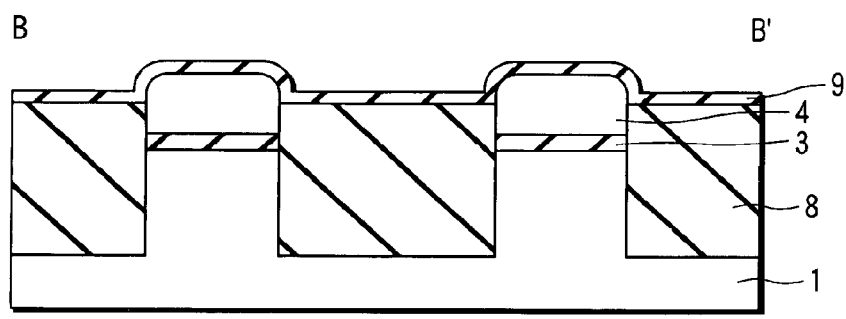

Subsequently, an inner wall of a trench formed in the silicon substrate 1 is oxidized, and then a buried insulating film 8 mainly composed of $SiO_2$ is deposited by a plasma CVD method. This buried insulating film 8 is polished and flattened to reach an upper side of the silicon nitride film 5 by a chemical mechanical polishing (CMP) method (FIG. 7). After removing the silicon nitride film 5 by wet processing, a height of the buried insulating film 8 is reduced by reactive ion etching (RIE) processing (FIG. 8).

A second gate insulating film 9 is formed on the thus formed isolation structure. The second gate insulating film 9 can be formed of a single-layer film containing a film selected from the group consisting of a silicon oxide film, a silicon nitride film, a silicon oxynitride film, a metal oxide film including at least one of Al, Hf, Zr and La, and a metal oxynitride film including at least one of Al, Hf, Zr and La, or have a stacked structure including two or more of such films. After forming the second gate insulating film 9 (FIG. 9), a polysilicon film 10 is formed on the second gate insulating film 9 by using a low pressure CVD (LPCVD) method. This polysilicon film 10 serves as a control electrode and is generally called a control gate.

Figure 10:
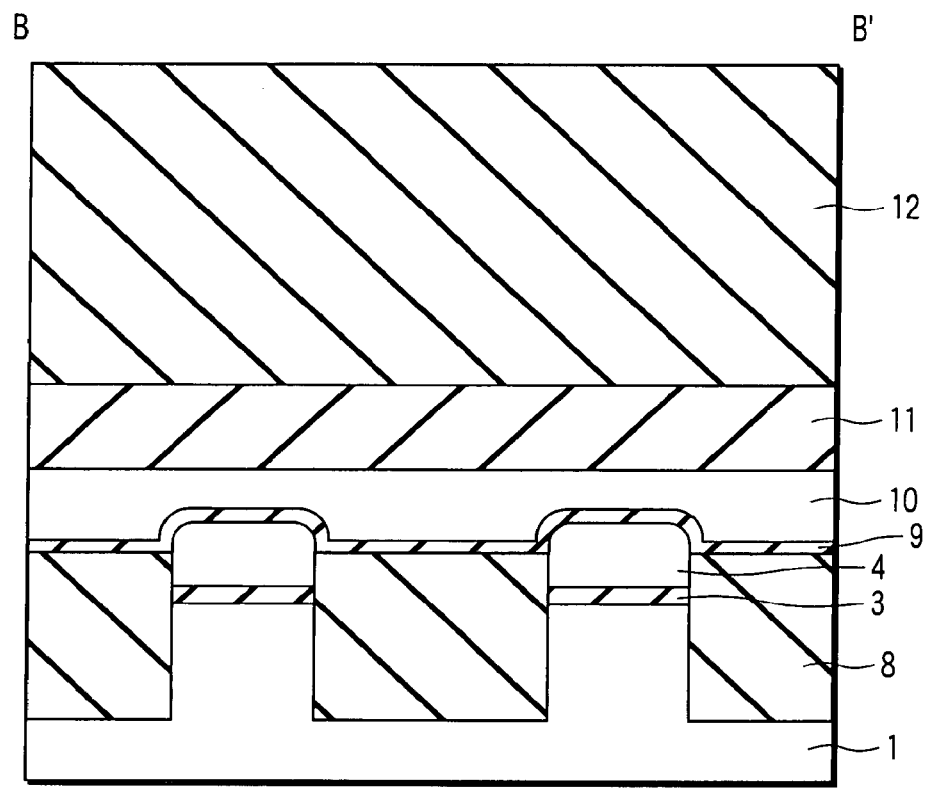
Figure 11:
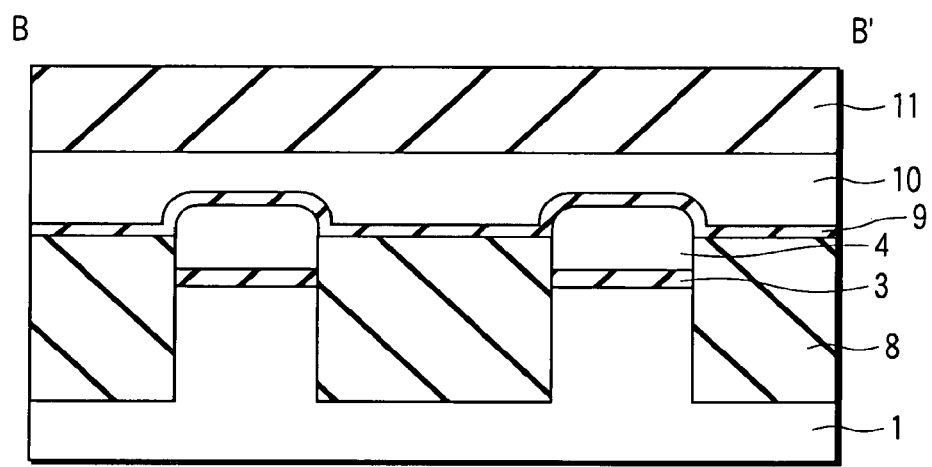
Figure 12:
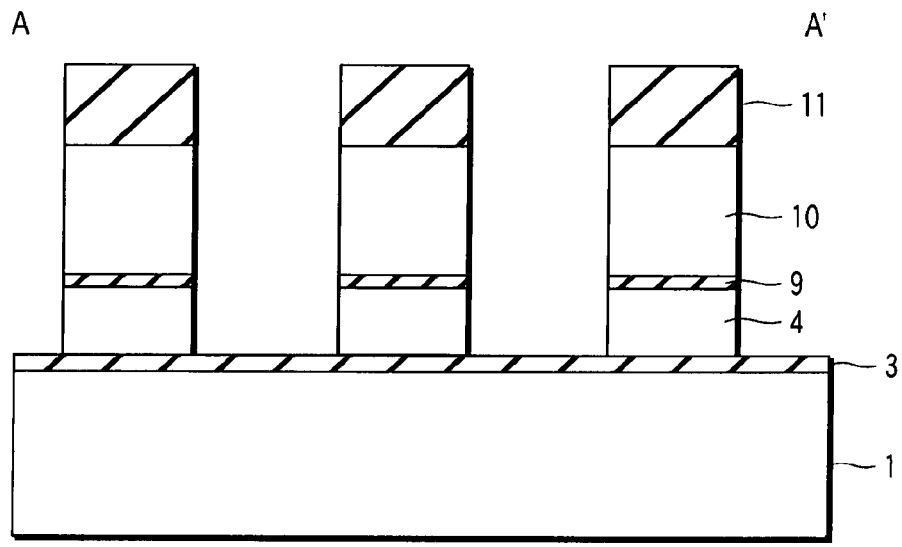
FIG. 12 is a cross-sectional view taken along a line A-A' at a step following FIG. 10.

A silicon nitride film 11 is formed on the control gate 10 by the LPCVD method. Additionally, a photoresist 12 is formed on the silicon nitride film 11 (FIG. 10). The silicon nitride film is formed into a desired pattern by using the lithography method, and then the photoresist 12 is removed. The control gate 10, the second gate insulating film 9 and the floating gate 4 are sequentially etched in a vertical direction with the silicon nitride film 11 being used as a mask. FIG. 11 is a cross-sectional view corresponding to a cross section taken along the line B-B' in FIG. 1 and FIG. 12 is a cross-sectional view corresponding to a cross section taken along the line A-A' in the same (which will be referred to as an A-A' cross-sectional view hereinafter) at this time.

Figure 13:
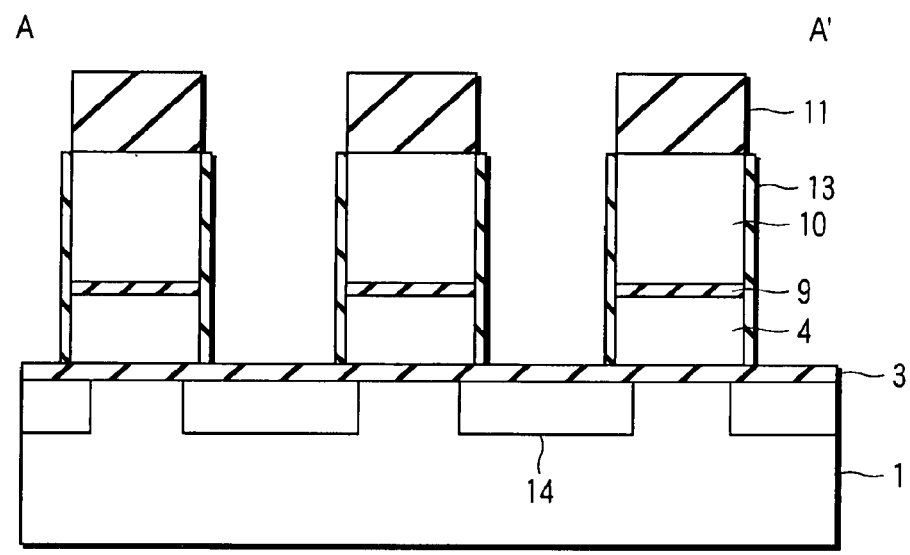
FIG. 13 is a cross-sectional view taken along the line A-A' at a step following FIG. 12.

Then, as shown in FIG. 13 (A-A' cross-sectional view), a silicon oxide film 13 is formed by using the thermal oxidation method for the purpose of recovering from a damage introduced to the gate oxide film due to RIE etching. In general, this oxidation step is called a post oxidation step, and the oxide film 13 formed at this step is called a post-oxide film.

Here, as a method of forming the silicon oxide film 13, performing radical oxidation is desirable. Radical oxidation is characterized in that an oxygen radical is used as an oxidizing species and oxidation using a thermal energy is rarely performed since oxidation is effected at a low temperature. The radical oxidizing species enters to reach a depth of approximately several nm, and is deactivated at this depth. In case of forming the silicon oxide film 13 by using a regular thermal energy, the oxidizing species diffuses in the second gate insulating film 9 and the silicon oxynitride film 3. As a result, a bird's beak is formed between the floating gate 4 and the control gate 10 and between the silicon substrate 1 and the floating gate 4. In such a case, a corner portion of the floating gate 4 in a cross section (FIG. 13, i.e., the A-A' cross-sectional view) along a direction vertical to the word lines is rounded, and a shape of the floating gate intended by this embodiment cannot be formed.

On the other hand, in case of performing radical oxidation, sidewalls of the polysilicon 4 and 10 are oxidized for several nm simultaneously with diffusion in the second gate insulating film 9 and the silicon oxynitride film 3. However, an entering length is several nm, the obvious bird's beak is not formed, and the corner portion of the floating gate 4 in the cross section (FIG. 13, i.e., the A-A' cross-sectional view) along the direction vertical to the word lines is not remarkably rounded. As conditions of radical oxidation, it is desirable to subject a gas in which at least one of inert gases He, Ne, Kr and Xe is mixed in oxygen to plasma excitation at a temperature of approximately 300 to 600° C. and use an oxygen radical generated from this plasma excitation. Hydrogen may be mixed in a mixed gas containing oxygen and an inert gas to generate a water molecular radical in some cases. Although an oxidizing species in such a case is a water molecular radical rather than an oxygen radical, the same effect as that of the oxygen radical can be obtained since an entering length is several nm like the oxygen radical.

Subsequently, the oxide film 13 is formed, then an ion is implanted into the silicon substrate by ion implantation in order to form a source and a drain, and activation is performed by thermal annealing, thereby forming a memory transistor (FIG. 13).

Figures 14A, 14B:
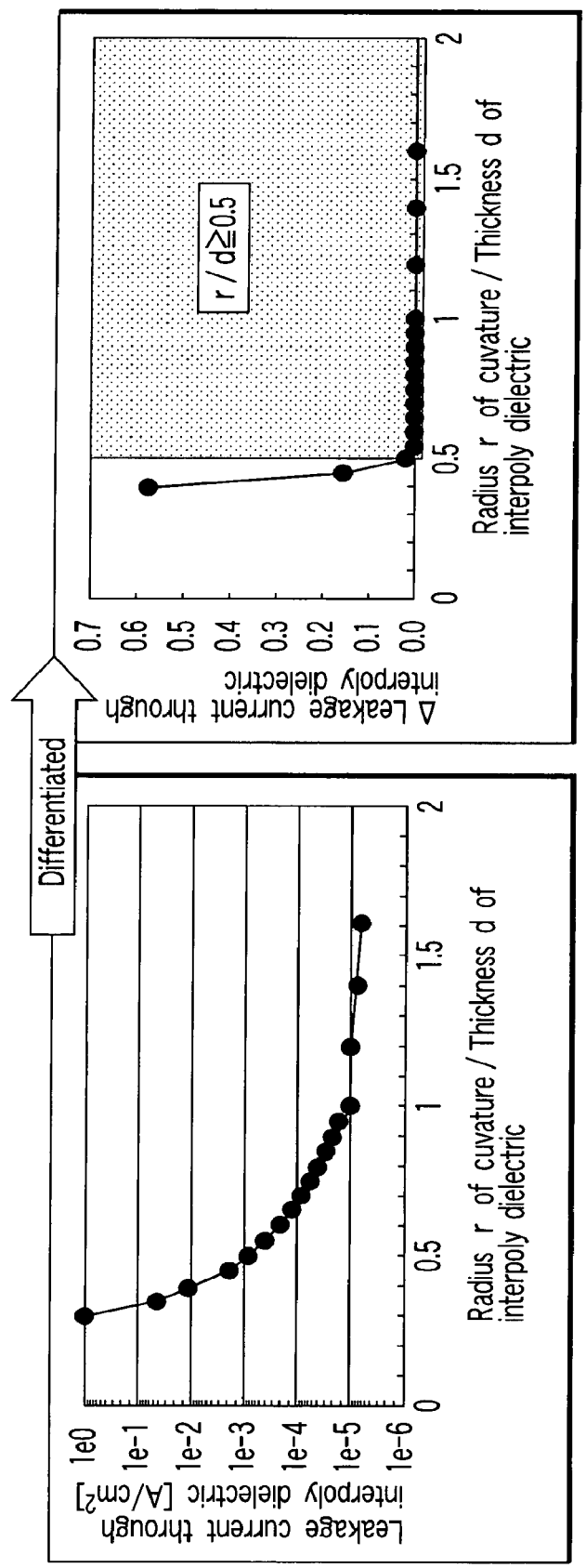
FIGS. 14A and 14B are characteristic views showing a relationship between a radius of curvature of a floating gate corner and leakage current.
Figure 15:
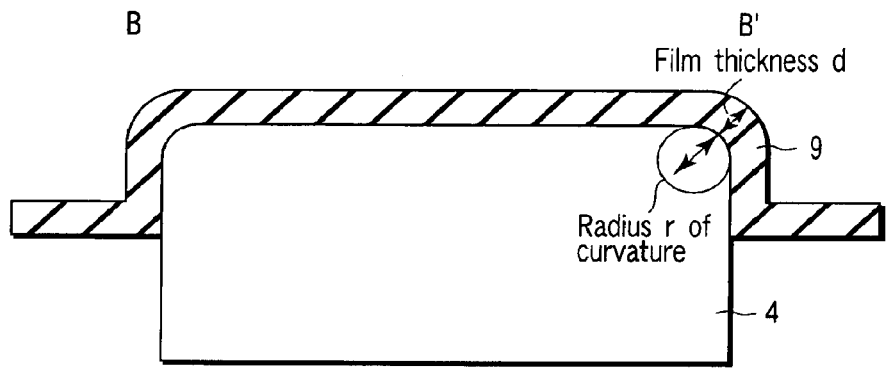
FIG. 15 is a schematic view illustrating portions measured and mentioned in FIG. 14.

As shown in FIG. 7 mentioned above, when the RIE processing which reduces a height of the buried insulating film 8 is carried out after wet processing which removes the silicon nitride film 5, there can be obtained an effect that the corner portion of the floating gate 4 is etched and rounded by the RIE processing. When a radius of curvature of the floating gate 4 becomes larger than a film thickness of the gate insulating film 9, an electric field applied to the corner portion is reduced. Incidentally, FIG. 14A shows a relationship between a ratio of a radius r of curvature of the floating gate corner portion and a film thickness d of an inter-electrode insulating film (interpoly insulating film) and leakage current density (A/cm$^2$) flowing through the second gate insulating film 9 when 14 V is applied between the control gate 10 and the floating gate 4. The leakage current density is abruptly reduced when the ratio is increased (in other words, an electric field applied to the corner portion is reduced). It can be understood from FIG. 14A that leakage current substantially converges on a fixed value when r/d becomes not smaller than 1 (or d/r becomes not greater than 1). FIG. 14B shows a plot of curve inclination (differential value of the curve) in FIG. 14A. A reduction in leakage current is dramatically generated in a region where r/d is not smaller than 0.5, and setting r/d≧0.5 is further preferable.

Figure 16A:
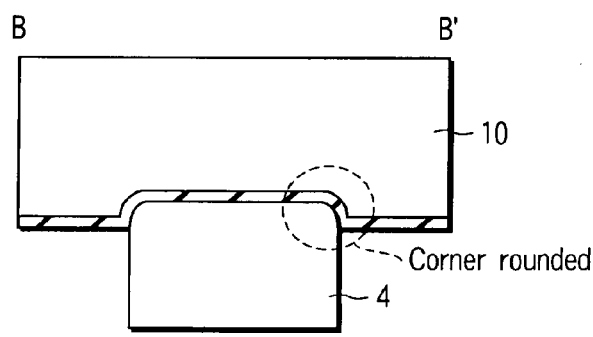
FIGS. 16A and 16B are schematic views illustrating characteristics of a shape of a stacked gate structure according to the present invention.
Figure 16B:
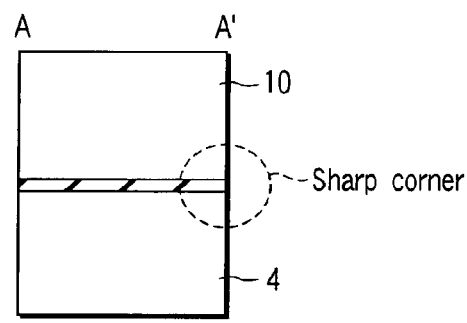

Furthermore, as different from a case where the radius of curvature of the floating gate 4 is increased by changing the method of forming the post-oxide film 13, in this embodiment, as shown in FIG. 16, the corner portion of the floating gate 4 is rounded only in a cross section (cross section taken along the line B-B' in FIG. 1) in a direction vertical to the bit lines, and it is not rounded in a cross section (cross section taken along the line A-A' in FIG. 1) vertical to the word lines. Therefore, as compared with the case where the gate corner portion is rounded by post oxidation, a reduction in the capacitance of the second gate insulating film 13, i.e., a reduction in a coupling ratio can be suppressed.

Second Embodiment

A manufacturing process of a cell array of an NAND cell type flash memory according to a second embodiment will now be described. Since a conformation in the drawings is the same as the first embodiment, a description will be given with reference to FIGS. 2 to 13.

First, the same processing as that in the first embodiment is carried out in FIGS. 2 to 7. Subsequently, a height of a buried insulating film 8 is reduced by etching having a small selectivity with respect to a silicon nitride film 5, and then wet processing to remove the silicon nitride film 5 is performed (FIG. 8). After forming a second gate insulating film 9 on the thus formed isolation structure (FIG. 9), steps shown in FIGS. 10 to 13 are executed like the first embodiment.

When the height of the buried insulating film 8 is reduced under etching conditions in which the selectivity with respect to the silicon nitride film 5 is small in this manner, there can be obtained an effect that each corner portion of the silicon nitride film and a floating gate 4 is rounded in particular (see FIG. 8). As etching conditions with the small selectivity, there is a method of reducing a flow ratio of $C_4F_8$ used in RIE, for example. Moreover, when a radius r of curvature of the floating gate 4 becomes equal to or greater than ½ of a film thickness d of a second gate insulating film 9 ($r/d \geq 0.5$), an electric field applied to each corner portion is reduced. When r/d is 1 or above in particular, leakage current of the second gate insulating film 9 can be dramatically reduced.

Additionally, each corner of the floating gate 4 is rounded only in a cross section (B-B' cross-sectional view) along a direction vertical to the bit lines and each corner portion is not rounded in a cross section (A-A' cross-sectional view) along a direction vertical to the word lines in the second embodiment like FIG. 16 as different from the prior art in which the radius of curvature of the floating gate 4 is increased by changing the method of forming the post-oxide film 13. Therefore, as compared with the case where the gate corner portion is rounded by post oxidation, a reduction in a capacitance of the second gate insulating film 9, i.e., a reduction in a coupling ratio can be suppressed.

Figure 17A:
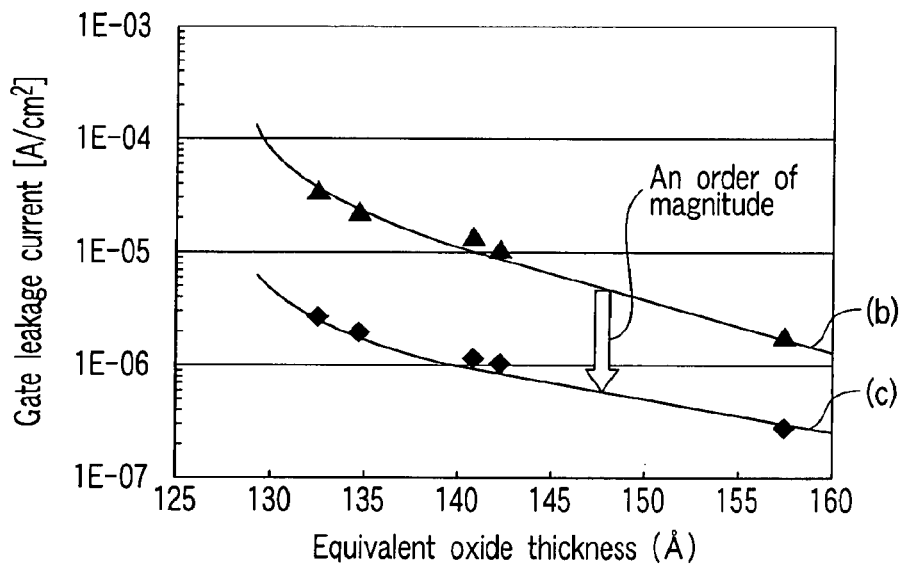
FIGS. 17A to 17C are schematic views illustrating an effect of the present invention, where
Figure 17B:
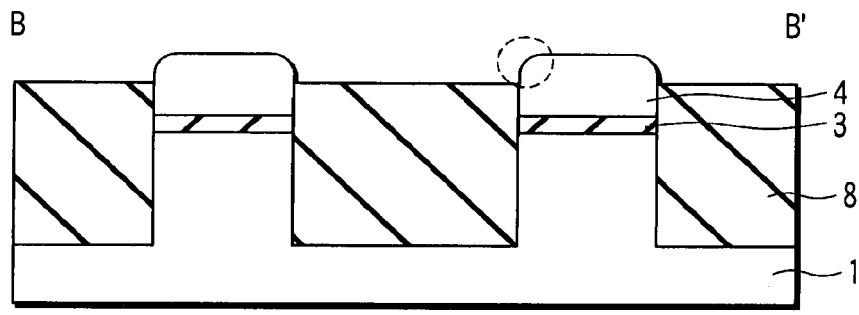
Figure 17C:
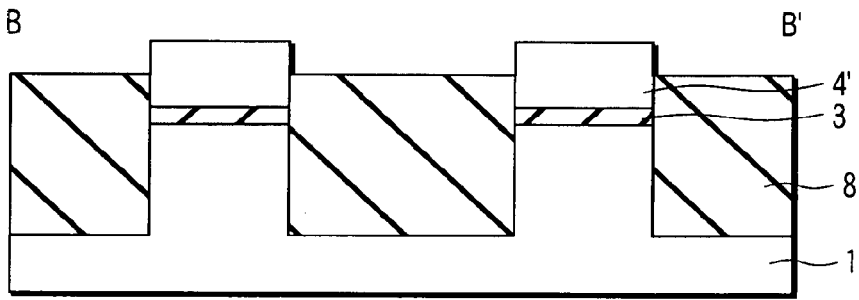

FIG. 17A shows a comparison between leakage current in a gate structure according to this embodiment and leakage current in a conventional gate structure. The abscissa represents an equivalent oxide thickness of the second gate insulating film 9, and the ordinate represents leakage current density ($A/cm^2$) flowing through the second gate insulating film 9 when 14 V is applied between the control gate 10 and the floating gate 4. A curve denoted as (c) in FIG. 17A shows the gate structure according to the present invention in which each upper corner portion of a first gate electrode 4 is rounded as depicted in FIG. 17B, and a curve denoted as (b) shows the gate structure as a comparative example in which each upper corner portion of the first gate electrode 4' is sharp as illustrated in FIG. 17C. It can be understood that leakage current is improved for an order of magnitude by adopting the structure according to this embodiment.

Although the description has been given as to suppression of leakage current at each upper corner portion of the floating gate in the first and second embodiments, leakage current is not restricted to the corner portion in the stacked gate structure, and the same problem occurs in surface roughness of a flat portion. In a third embodiment and following embodiments, a technology which suppresses such a problem will be described.

Third Embodiment

Figure 18:
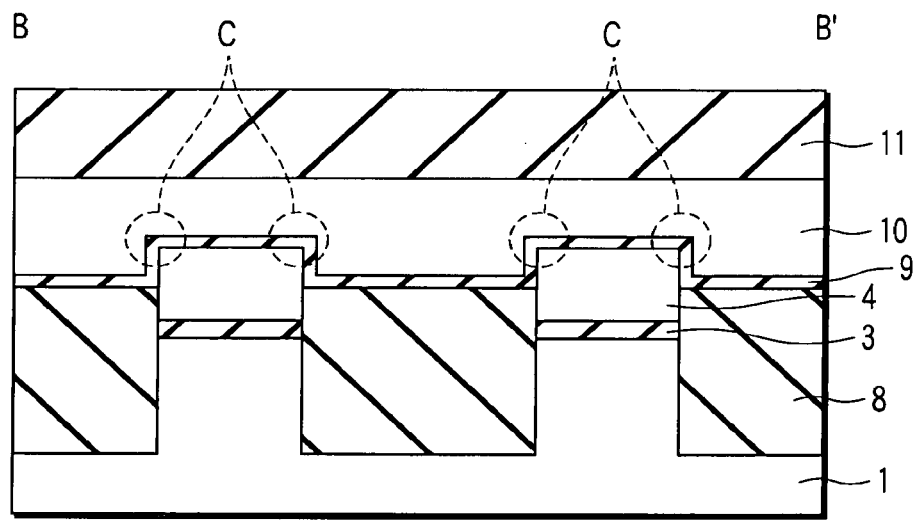
FIG. 18 is a cross-sectional view taken along the line B-B' illustrating a problem of a nonvolatile memory.
Figure 19:
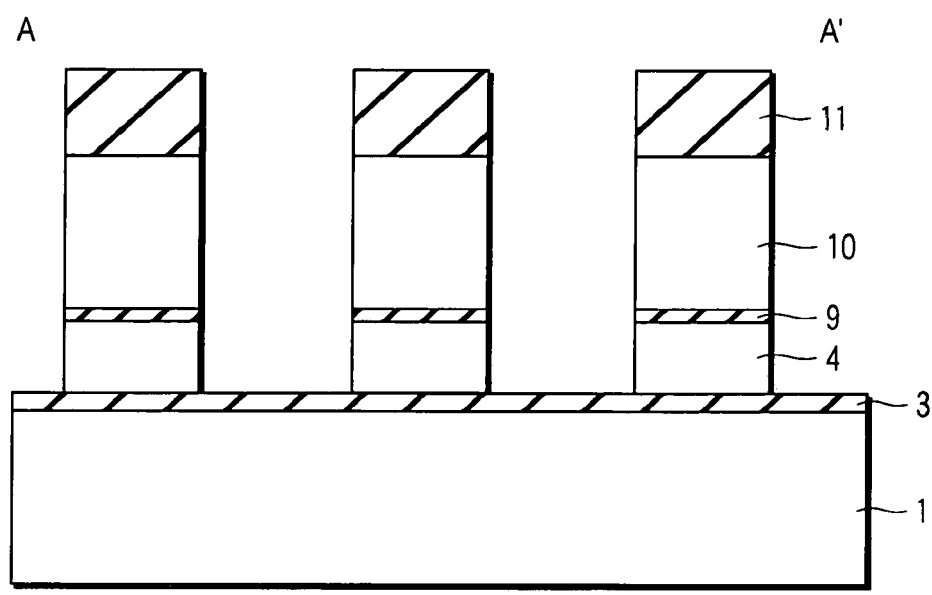
FIG. 19 is a cross-sectional view taken along the line A-A' illustrating a problem of the nonvolatile memory.

FIGS. 18 and 19 show cross sections of a nonvolatile semiconductor memory device. FIG. 18 is a cross-sectional view (B-B' cross-sectional view) along a direction vertical to bit lines and FIG. 19 is a cross-sectional view (A-A' cross-sectional view) along a direction vertical to word lines mentioned in FIG. 16. Here, although FIG. 18 shows a part where an inter-electrode insulating film 9 is in contact with a floating gate electrode 4, the inter-electrode insulating film 9 is formed into a three-dimensional shape having a inverted-U-like cross section rather than a flat surface, thereby increasing a capacitance between stacked gate electrodes. When the three-dimensional shape is formed in this manner, the insulating film between the gate electrodes comes into contact with each convex portion of the floating gate electrode 4, and each corner portion C exists. FIG. 20B schematically shows this corner (convex) portion. FIG. 20A shows a result of examining a relationship between a density of leakage current flowing through the inter-electrode insulating film and r/d, where r is a radius of curvature and d is a film thickness of the inter-electrode insulating film 9 (an equivalent silicon oxide thickness). It is to be noted that a gate length L of this sample is 90 nm.

In FIG. 20A, the abscissa represents r (nm)/d (nm) and the ordinate represents leakage current density ($A/cm^2$) flowing through the inter-electrode insulating film 9 when −12 V is applied between the control gate 10 and the floating gate 4. The radius of curvature is changed by varying conditions of RIE when forming the floating gate and by adjusting a film thickness of a mask material at the time of RIE. It can be understood from FIG. 20A that leakage resistance properties gradually deteriorate when r/d becomes smaller than 1. That is because a tunneling probability of electrons in the insulating film between the gate electrodes is increased when the radius of curvature is reduced and an electric field is concentrated on each corner end portion. Although the radius of curvature which is large to some extent is preferable in terms of leakage, r/d which is not smaller than 0.5 (preferably, r/d which is not smaller than 1) is effective as its rough standard as mentioned above in relation to FIG. 14.

In the existing circumstances, as the inter-electrode insulating film thickness d, a value of 14 to 16 nm is often used. In such a case, r must be also set to a value which is not smaller than 14 nm in order to set an r/d value to be not smaller than 1. An area of the flat portion is reduced in the floating gate electrode shape having a three-dimensional structure as a cell size is decreased in the future. Control over this r/d value is very important.

In FIG. 21, the abscissa represents a gate width W (nm) in a bit line direction, and the ordinate represents leakage current density ($A/cm^2$) flowing through the inter-electrode insulating film 9 when −12 V is applied between the control gate 10 and the floating gate 4. A thickness of the gate insulating film is 14 nm in an equivalent silicon oxide thickness (EOT). When r/d=0.1 to 0.2, each electrode upper surface corner portion is very sharp, and leakage current is precipitously increased when a gate width is shortened. On the other hand, when r/d≅1.25, leakage current is gently increased as the gate width becomes small. Since the radius of curvature and the capacitor surface area are calculated based on an analysis of a transmission electron microscopy (TEM) image, it is considered that qualitative behaviors can be represented although a slight error is included.

When each corner portion is sharp, leakage current is increased as the gate width is decreased, and this tendency becomes prominent when the gate width is not greater than 90 nm. Although a main path of leakage current is the corner portion, a current density obtained by dividing leakage current by the capacitor area indicates a low value since an electrode area is large when a gate length is large.

On the other hand, when the gate length becomes small, the current density is increased. When the gate length is small, most of the leakage current flows through each corner portion. Therefore, when the gate length is not greater than 90 nm, the effect of setting r/d≧1 is very large.

Here, although polysilicon is often used for the floating gate electrode, micro roughness exist on a polysilicon surface, and a convex portion having a very small radius of curvature also exists. This convex portion is also a factor of deteriorating leakage resistance properties. However, such surface roughness have a small effect on the leakage resistance properties as compared with the corner portion C shown in FIG. 18.

Figure 22:
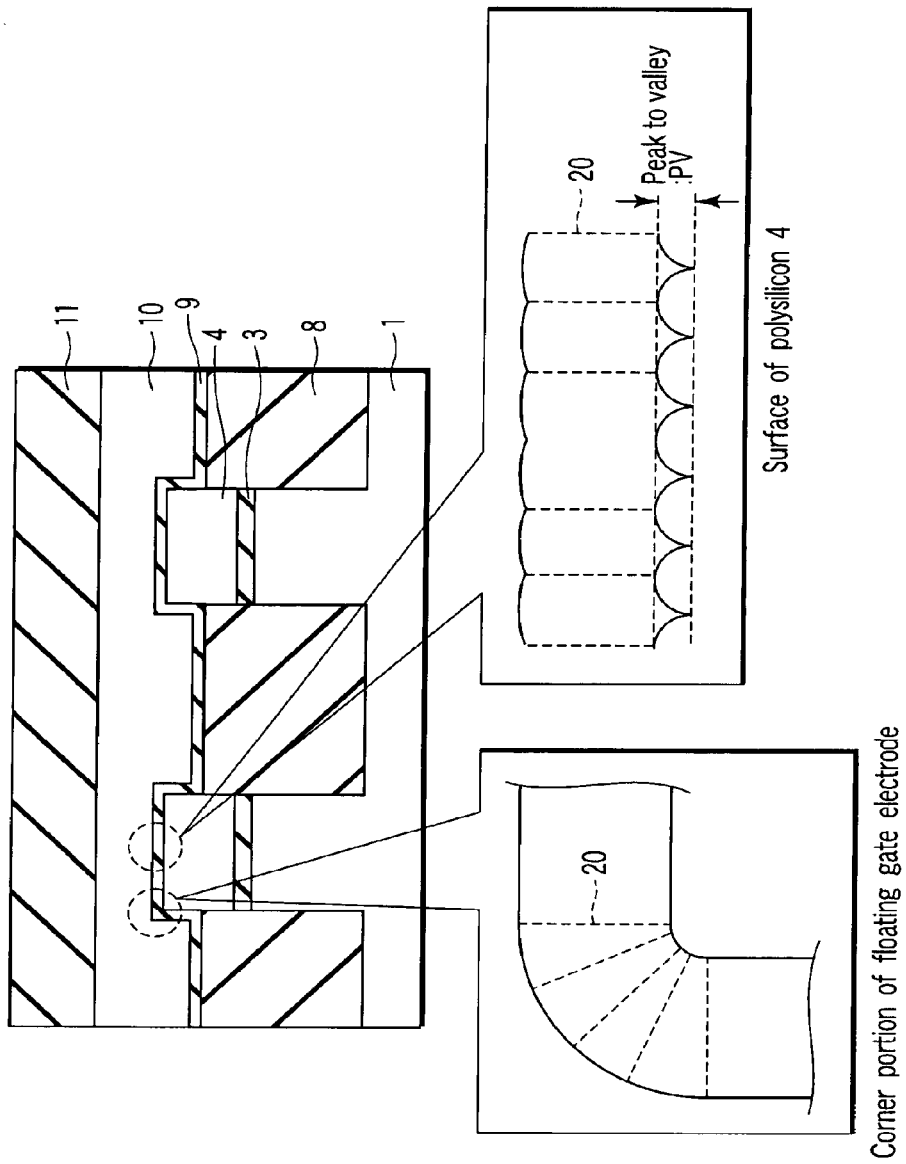
FIG. 22 is a schematic view illustrating a concentration of a current on a corner portion of a floating gate and surface roughness on an electrode surface.

FIG. 22 shows a schematic view of a concentration of an electric field on the corner portion of the floating gate electrode 4 and surface roughness on the polysilicon (lines of electric force 20 are indicated by dotted lines). A density of lines of electric force in the vicinity of the upper control gate electrode 10, i.e., an electric field is the same, whereas a density of lines of electric force concentrated on the corner portion is large. On the other hand, since lines of electric force are not concentrated on one convex portion on the polysilicon surface, a local concentration of an electric field is hardly generated. It can be said that a degree of concentration of an electric field varies depending on the electrode corner portion and the surface irregular portion.

However, FIG. 23 shows a relationship between a ratio of the interpoly insulating film thickness (the equivalent silicon oxide thickness) d and roughness PV (peak to valley) on the polysilicon surface and leakage current. The abscissa represents d (nm)/PV (nm), and the ordinate represents leakage current density (A/cm$^2$) at the time of −12 V in J-V characteristics. It is to be noted that a gate width L in the bit line direction in this case is 90 nm. An alkali cleaning time with respect to the polysilicon surface is changed to form the polysilicon surfaces having different PV values. It can be understood from the drawing that leakage current density is precipitously increased when a value of d/PV is not greater than 2. At the surface corner portion of the floating gate electrode, since a concentration of an electric field occurs on this part in particular, the leakage resistance sensitively varies with respect to a change in surface roughness. It can be said that controlling the surface roughness at the corner portion is very important to improve the leakage resistance. When the d/PV value is set to be not smaller than 2 in a state where r/d is not smaller than 1, deterioration in the leakage resistance can be suppressed to the minimum level.

Further, in crystal grains of polysilicon constituting the corner portion, assuming that a curvature of a convex part is r', deterioration in the leakage resistance does not occur when this curvature is set to r'/d≧1. A part where r'/d is set is an end shape of the convex portion which is closest to the upper electrode. In regard to control over the radius r' of curvature, when the surface is once subjected to radical oxidation, the convex portion is flattened and r' is increased. r'/d≧1 of the convex portion closest to the upper electrode can be sufficiently satisfied. Furthermore, reactive ion etching at the time of processing the floating gate electrode, each corner portion can be rounded and r'/d 1 can be realized.

It is to be noted that, as the current inter-electrode insulating film thickness d, a value of 14 to 16 nm is often used. In such a case, a PV value must be set to 7 to 8 nm or below in order to set a d/PV value to be not smaller than 2. Although polysilicon is often used for the floating gate, a surface morphology thereof is generally roughened and a PV value becomes not smaller than 7 nm after various kinds of thermal processing. A technique which reduces polysilicon surface roughness is required.

Accordingly, FIGS. 24 to 29 show a method of forming a nonvolatile semiconductor memory device by which an r/d value becomes not smaller than 1 and a d/PV value becomes not greater than 2. These drawings are cross-sectional views (cross-sectional views taken along the line A-A' in FIG. 1) in a direction vertical to the word lines. For the better understanding, like reference numerals denote parts equal to those in the first embodiment.

First, a silicon oxide film 2 is formed on a silicon substrate 1 by using a thermal oxidation method (FIG. 24). This silicon oxide film 2 is nitrided by using an NH$_3$ gas to provide a silicon oxynitride film 3 (FIG. 25). An amorphous silicon film 4 in which phosphorus is added as an impurity is formed on this silicon oxynitride film 3 by using a CVD method. This amorphous silicon film 4 is crystallized at a post thermal step to become a floating gate polysilicon electrode as a charge accumulation layer.

It is to be noted that the following processing is carried out when polycrystallizing the amorphous silicon film 4 for flattening. A silicon oxide film is formed with respect to the amorphous silicon film 4 in a radical oxidizing atmosphere at 400° C., and then a thermal process is performed at approximately 900° C. This low-temperature radical oxidation is very useful to suppress an increase in surface roughness.

The silicon oxide film is formed in order to avoid out-diffusion of a dopant in silicon, prevent migration of surface silicon atoms in the post thermal process at 900° C. and suppress surface roughness. In oxidation at 400° C., silicon remains in an amorphous condition. Knowledge that surface roughness can be suppressed by in the first place performing radial oxidation processing with respect to the surface in a state where this silicon remains in the amorphous condition and in the second place crystallizing this surface is new. It is good enough for an oxidizing temperature to be not greater than 550° C. at which amorphous silicon is not crystallized and, to be not lower than 700° C. at a subsequent crystallization heat treatment step.

Additionally, crystal grains are sufficiently grown at a heat treatment step at 900° C., and considerable crystal grain growth is not observed at a subsequent heat treatment step following this step. It is to be noted that oxidation using the radical oxidizing species is utilized when forming the silicon oxide film. On the contrary, in case of oxidation processing in molecular oxygen, a difference in local oxidizing rate is generated due to dopant segregation in the grain boundary of the polysilicon, and hence the surface is roughened.

At last, the silicon oxide film formed on the surface of the floating gate polysilicon film 4 by radical oxidation is removed by using hydrofluoric acid. It is to be noted that a hydrofluoric acid chemical solution also becomes a factor which roughens the polysilicon surface. Although the hydrofluoric acid chemical solution or extra-pure water is a chemical solution used in cleaning processing, the silicon surface is etched by an OH ion in such a liquid. Since its etching rate varies depending on each plane orientation, just performing cleaning processing to remove the oxide film increases roughness of the polysilicon surface. Thus, in order to suppress the surface roughness in the chemical solution processing, a low-pH liquid solution having a smaller amount of OH must be used. For example, when removing the oxide film, a mixed liquid solution containing diluted hydrofluoric acid and hydrochloric acid must be used and a pure water rinse processing time must be reduced.

According to this method, PV can be set to a value which is not greater than 7 to 8 nm by stabilizing a crystal grain size of polysilicon used for the floating gate and adopting cleaning or the like which does not roughen the surface as much as possible.

Subsequently, a second gate insulating film 9 serving as an inter-electrode insulating film is formed on the polysilicon film 4. The second gate insulating film 9 can be constituted of a single layer including anyone of a silicon oxide film, a silicon nitride film, a silicon oxynitride film, a metal oxide thin film containing at least one of Al, Hf, Zr and La, and a metal oxynitride thin film containing at least one of Al, Hf, Zr and La, or a stacked structure of these films. A polysilicon film 10 in which phosphorus is added as an impurity is formed on this insulating film 9 by using an LPCVD method. This polysilicon film 10 is gate polysilicon functioning as a control gate electrode later. A silicon nitride film 11 is formed on this gate polysilicon film 10 by the LPCVD method (FIG. 26). Further, a photoresist 12 is applied to an upper surface of the silicon nitride film 11. This product is formed into a desired pattern by using a lithography method (FIG. 27), and then the photoresist 12 is removed. The control gate polysilicon film 10, the floating gate insulating film 9 and the floating gate polysilicon film 4 are sequentially etched in the vertical direction with the silicon nitride film 11 being used as a mask (FIG. 28). Furthermore, in order to form a source and a drain, phosphorus (P) is implanted into the silicon substrate by ion implantation, and activation is carried out by thermal annealing, thereby bringing the nonvolatile semiconductor memory device to completion (FIG. 29).

When the stacked gate electrode is formed as described above, the surface morphology of the floating gate electrode is controlled, the leakage resistance of the floating gate insulating film is increased, and the electrical reliability is considerably improved.

Although the above has described the present invention based on the embodiments, leakage current can be suppressed through the second gate insulating film (inter-electrode insulating film) to improve the electrical reliability. Further, the present invention is not restricted to the foregoing embodiments. For example, although the description has been given as to the NAND flash as an example in the first embodiment, the present invention can be applied to, e.g., an MONOS or the like using a silicon nitride film as a charge accumulation layer for a floating gate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor memory device, the method comprising:
    forming a first gate insulating film above a semiconductor substrate;
    sequentially forming a charge accumulation layer and a mask layer on the first gate insulating film;
    processing the mask layer into a predetermined pattern;
    etching the charge accumulation layer, the first gate insulating film and an upper part of the semiconductor substrate to form a plurality of gate structures with the processed mask layer being used as a mask;
    filling a buried insulating film between the plurality of gate structures;
    flattening the buried insulating film, followed by setting an upper surface of the buried insulating film to be lower than an upper surface of the charge accumulation layer, and rounding an upper corner of the charge accumulation layer;
    depositing a second gate insulating film on an entire surface after rounding the upper corner of the charge accumulation layer;
    forming a control electrode layer on the second gate insulating film;
    patterning the control electrode layer to form a plurality of control gates along a first direction; and
    etching a stacked film composed of the second gate insulating film, the charge accumulation layer and the first insulating film to form a plurality of stacked gate structures with the plurality of control gates being used as a mask,
    wherein said rounding the upper corner of the charge accumulation layer includes rounding the upper corner of the charge accumulation layer in a cross section along a second direction perpendicular to the first direction.

2. The method according to claim 1, wherein said depositing the second gate insulating film includes forming a single-layer film containing a film selected from the group consisting of a silicon oxide film, a silicon nitride film, a silicon oxynitride film, a metal oxide film containing at least one of Al, Hf, Zr and La, and a metal oxynitride film containing at least one of Al, Hf, Zr and La, or forming a stacked structure including two or more of foregoing films.

3. The method according to claim 1, further comprising forming sidewall insulating films on side surfaces of the plurality of stacked gate structures,
    wherein said forming sidewall insulating films on side surfaces of the plurality of stacked gate structures includes radical oxidation in a radical oxygen atmosphere containing an inert gas at a temperature not lower than 300° C. and not higher than 600° C., and the inert gas used in said forming the sidewall insulating films contains one selected from the group consisting of He, Ne, Kr and Xe.

4. A method of manufacturing a semiconductor memory device, the method comprising:
    forming a first insulating film above a semiconductor substrate;
    forming an amorphous silicon film on the first insulating film;
    subjecting a surface of the amorphous silicon film to radical oxidation in a radical oxygen atmosphere at a temperature not higher than 550° C. to form a radical oxide film;
    crystallizing the amorphous silicon film at a temperature not lower than 700° C. to form a first polysilicon layer serving as a charge accumulation layer after the radical oxidation;
    removing the radical oxide film by using a mixed liquid containing diluted hydrofluoric acid and hydrochloric acid;
    forming a second insulating layer on the first polysilicon layer from which the radical oxide film is removed;

forming a second polysilicon layer on the second insulating layer;

processing the second polysilicon layer into a predetermined pattern to form a plurality of control gates by photolithography; and etching a stacked film composed of the first insulating film, the first polysilicon film and the second insulating film to form a plurality of stacked gate structures with the plurality of control gates being used as a mask.

5. The method according to claim 4, wherein said depositing the second gate insulating film includes forming a single-layer film containing a film selected from the group consisting of a silicon oxide film, a silicon nitride film, a silicon oxynitride film, a metal oxide film containing at least one of Al, Hf, Zr and La, and a metal oxynitride film containing at least one of Al, Hf, Zr and La, or forming a stacked structure including two or more of foregoing films.

* * * * *